United States Patent
Bemanian et al.

(10) Patent No.: US 6,904,586 B1
(45) Date of Patent: Jun. 7, 2005

(54) INTEGRATED CIRCUIT HAVING INTEGRATED PROGRAMMABLE GATE ARRAY AND FIELD PROGRAMMABLE GATE ARRAY, AND METHOD OF OPERATING THE SAME

(75) Inventors: Majid Bemanian, Pleasanton, CA (US);
William D. Scharf, San Jose, CA (US);
Bruce L. Entin, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 128 days.

(21) Appl. No.: 10/105,579

(22) Filed: Mar. 25, 2002

(51) Int. Cl.[7] .............................................. G06F 17/50
(52) U.S. Cl. ........................... 716/16; 716/17; 716/8
(58) Field of Search .................................. 716/16, 17, 8, 716/1; 326/39, 40, 41; 710/5, 305

(56) References Cited

U.S. PATENT DOCUMENTS

| | | | | |
|---|---|---|---|---|
| 5,424,589 A | * | 6/1995 | Dobbelaere et al. | 326/41 |
| 5,535,342 A | * | 7/1996 | Taylor | 710/315 |
| 5,603,043 A | * | 2/1997 | Taylor et al. | 712/1 |
| 6,094,065 A | * | 7/2000 | Tavana et al. | 326/39 |
| 6,188,912 B1 | * | 2/2001 | Struhsaker et al. | 455/561 |
| 6,204,687 B1 | * | 3/2001 | Schultz et al. | 326/40 |
| 6,211,697 B1 | * | 4/2001 | Lien et al. | 326/41 |
| 6,331,790 B1 | * | 12/2001 | Or-Bach et al. | 326/41 |
| 6,526,340 B1 | * | 2/2003 | Reul et al. | 701/29 |
| 6,531,889 B1 | * | 3/2003 | Leitch | 326/39 |
| 6,614,267 B2 | * | 9/2003 | Taguchi | 326/101 |
| 2002/0026539 A1 | * | 2/2002 | Murthukumaraswamy et al. | 710/5 |
| 2002/0066956 A1 | * | 6/2002 | Taguchi | 257/734 |
| 2002/0122386 A1 | * | 9/2002 | Calvignac et al. | 370/230 |
| 2003/0062922 A1 | * | 4/2003 | Douglas et al. | 326/39 |
| 2003/0110339 A1 | * | 6/2003 | Calvignac et al. | 710/305 |
| 2003/0110463 A1 | * | 6/2003 | Kuhlmann et al. | 716/17 |
| 2003/0217215 A1 | * | 11/2003 | Taborek et al. | 710/305 |

OTHER PUBLICATIONS

J. Ascierto et al., FPGAs add fixed cores for communication drive. EETimes article [online], [retrieved on Sep. 26, 2003]. Retrieved from the Internet <http:www.eetimes.com.story/OEG20010514S>.*

* cited by examiner

*Primary Examiner*—A. M. Thompson
(74) *Attorney, Agent, or Firm*—Hitt Gaines & Boisbrun, P.C.

(57) ABSTRACT

An integrated circuit (IC) and a method of manufacturing an integrated circuit suited for a particular application. In one embodiment, the IC includes at least two interfaces, a field-programmable gate array (FPGA) and a programmable gate array (PGA). The FPGA has a configuration memory associated therewith and is coupled to the at least two interfaces for communicating data therebetween. The PGA is coupled to and configured to cooperate with the FPGA to adapt the IC to a particular surrounding environment.

14 Claims, 3 Drawing Sheets

INTEGRATED CIRCUIT HAVING INTEGRATED PROGRAMMABLE GATE ARRAY AND FIELD PROGRAMMABLE GATE ARRAY, AND METHOD OF OPERATING THE SAME

TECHNICAL FIELD OF THE INVENTION

The present invention is directed, in general, to field-programmable gate arrays (FPGAs) and, more specifically, to an integrated circuit (IC) having an integrated FPGA and a programmable gate array (PGA) and a method of manufacturing an IC that is suited for a particular application.

BACKGROUND OF THE INVENTION

Today's demand for ever-increasing bandwidth continues to push the limits of broadband packet network processors. Such processors interconnect optical fiber segments that make up the backbone of packet networks (such as the Internet) and are employed to switch data among the segments to route them rapidly through the network. As the data traverse the processors, they must be tracked and made to conform to various protocols. Accordingly, the processors themselves include hardware for tracking the data and translating them among the various protocols. This hardware includes serializer/deserializer crossconverters, forward error correctors, framers, mappers, traffic classification and management co-processors, network processors, control plane processors and backplane physical layer interfaces, and switch fabrics.

In practice, this hardware is implemented in application-specific integrated circuits (ASICs), application-specific standard product integrated circuits (ASSPs) or other integrated circuits (ICs). These ASICs, ASSPs and ICs must be coupled to one another to form the processor.

Unfortunately, coupling these circuits together has proven problematic. Interface mismatches occur when the signals that the circuits transmit or expect to receive are not identical. Interface mismatches also occur when transmit and receive speeds differ.

The conventional approach to addressing this problem has been to place a "bridge" between the circuits that are to be coupled to one another. Often, bridges are made from field-programmable gate arrays (FPGAs). Logic within the FPGA modifies or buffers data as necessary to provide the proper interface. Though they are flexible, FPGAs are expensive. Today's data rates are also becoming too great for FPGAs to handle.

ASICs can be used instead of FPGAs. The logic within the FPGAs can be effected within an ASIC, but time and money are required. Further hampering the adoption of ASICs is the fact that they are not readily modifiable should interface requirements change.

Accordingly, what is needed in the art is a new architecture that has at least some of the speed, size and cost advantages of ASICs, but the flexibility of FPGAs.

SUMMARY OF THE INVENTION

To address the above-discussed deficiencies of the prior art, the present invention provides an IC and a method of manufacturing an integrated circuit suited for a particular application. In one embodiment, the IC includes: (1) at least two interfaces, (2) a PGA associated therewith and coupled to the at least two interfaces for communicating data therebetween and (3) an FPGA having a configuration memory and coupled to and configured to cooperate with the PGA to adapt the IC to a particular surrounding environment.

The present invention therefore introduces the broad concept of a hybrid IC containing a PGA, an FPGA or both, that effects communication of data with at least two interfaces on the IC. In an embodiment to be illustrated and described, the PGA is configured during IC fabrication with at least a portion of a design (perhaps including portions that require the PGA's superior speed of operation). Following fabrication, the FPGA's configuration memory is provided a configuration program that augments the functions carried out in the PGA. The configuration program may cause the FPGA to perform functions not performed by the PGA (such as those requiring less speed) or that supersede functions performed by the PGA (perhaps caused by errors in the PGA configuration. The resulting IC offers to a designer both the pre-fabrication advantages of a PGA (speed, size, cost and initial configuration flexibility) and the post-fabrication advantages of an FPGA (continuing configuration flexibility).

In various embodiments of the present invention that will hereinafter be illustrated and described, the IC further includes a standard input-output interface, a second standard input-output interface, a block of embedded memory, a double data rate interface for access to external memory, a co-processor coupled to the embedded memory and a bus expander.

In one embodiment of the present invention, the at least two interfaces are selected from the group consisting of: (1) a system physical interface (SPI) and (2) a 10-Gigabit Attachment Unit Interface (XAUI). Those skilled in the pertinent art will understand, however, that other conventional or later-discovered interfaces are within the broad scope of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

DESCRIPTION OF THE DRAWINGS

For a more complete understanding of the present invention, reference is now made to the following descriptions taken in conjunction with the accompanying drawings, in which.

DETAILED DESCRIPTION

Figure 1:
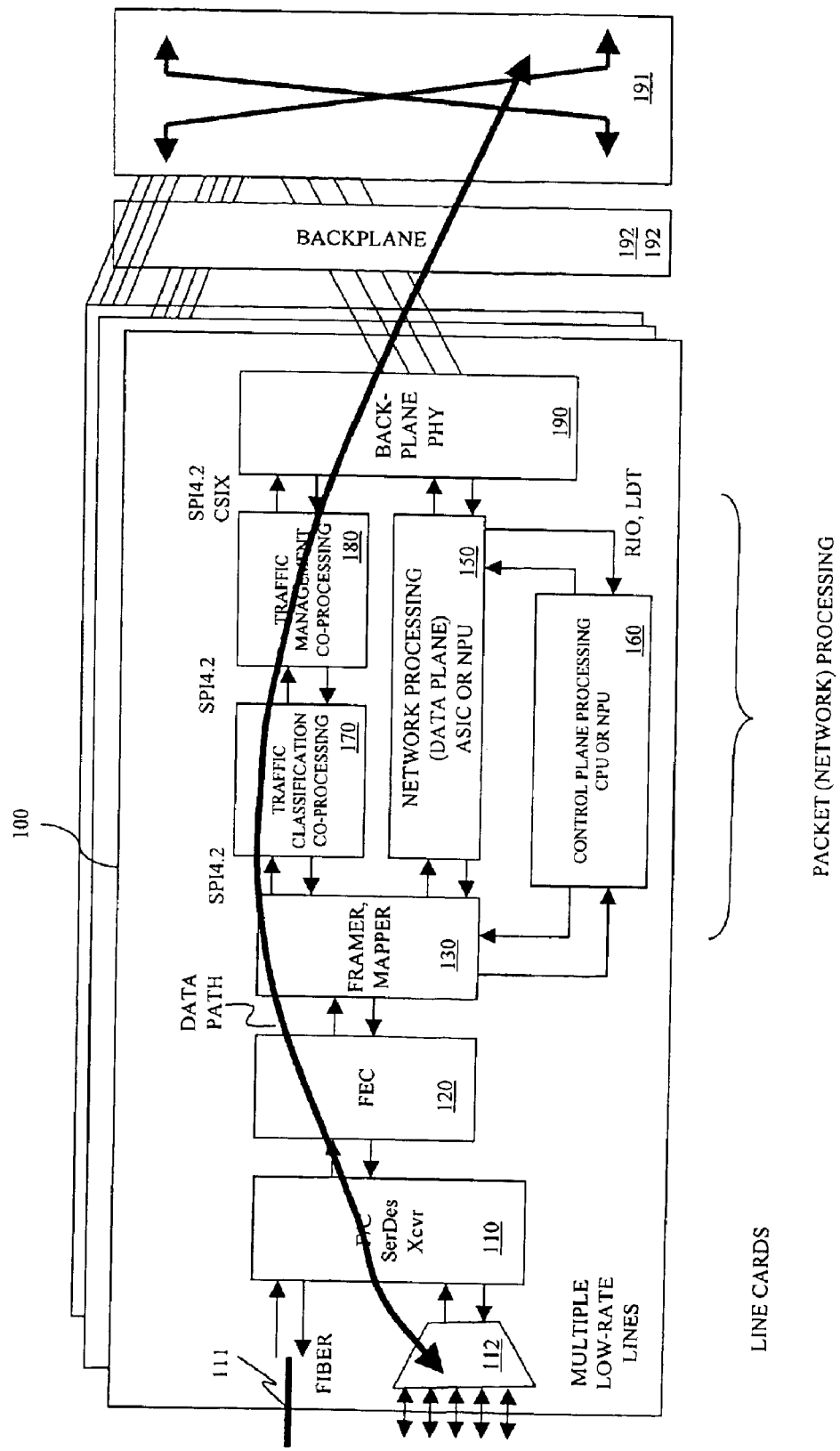
FIG. 1 illustrates a block diagram of a line card containing a broadband packet network processor that forms an environment within which a PGA constructed according to the principles of the present invention can operate.

Referring initially to FIG. 1, illustrated is a block diagram of a line card containing a broadband packet network processor, generally designated 100, that forms an environment within which the FPGA constructed according to the principles of the present invention can operate.

The processor 100 is illustrated as including serializer/deserializer (serdes) 110 coupled to a high-speed optical fiber interface 111 and/or low-speed communication lines 112. The serdes 110 is coupled to a forward error corrector (FEC) 120 which is, in turn, coupled to a framer/mapper 130. The framer/mapper 130 splits packets or cells into a payload stream and a control stream. The payload stream undergoes network processing in a processor 150, while the control stream undergoes control processing in a processor 160.

A traffic classification co-processor 170 and traffic management co-processor 180 cooperate to manage traffic within the processor 100. A backplane physical layer (PHY) interface 190 communicates with a switch fabric 191 via a backplane connector 192.

The IC of the present invention finds advantageous use in several exemplary locations within the processor 100. The IC may be used to intermediate between the FEC 120 and the framer/mapper 130, between the framer/mapper 130 and the traffic classification co-processor 130, between the traffic classification co-processor 170 and the traffic management co-processor 180, between the traffic management co-processor 170 and the backplane PHY interface 190 and between the traffic classification co-processor 170 and the processor 150. Each of these locations within the processor 100 is subject to interface mismatches and represents a different environment within which an IC constructed according to the principles of the present invention must operate.

Figure 2:
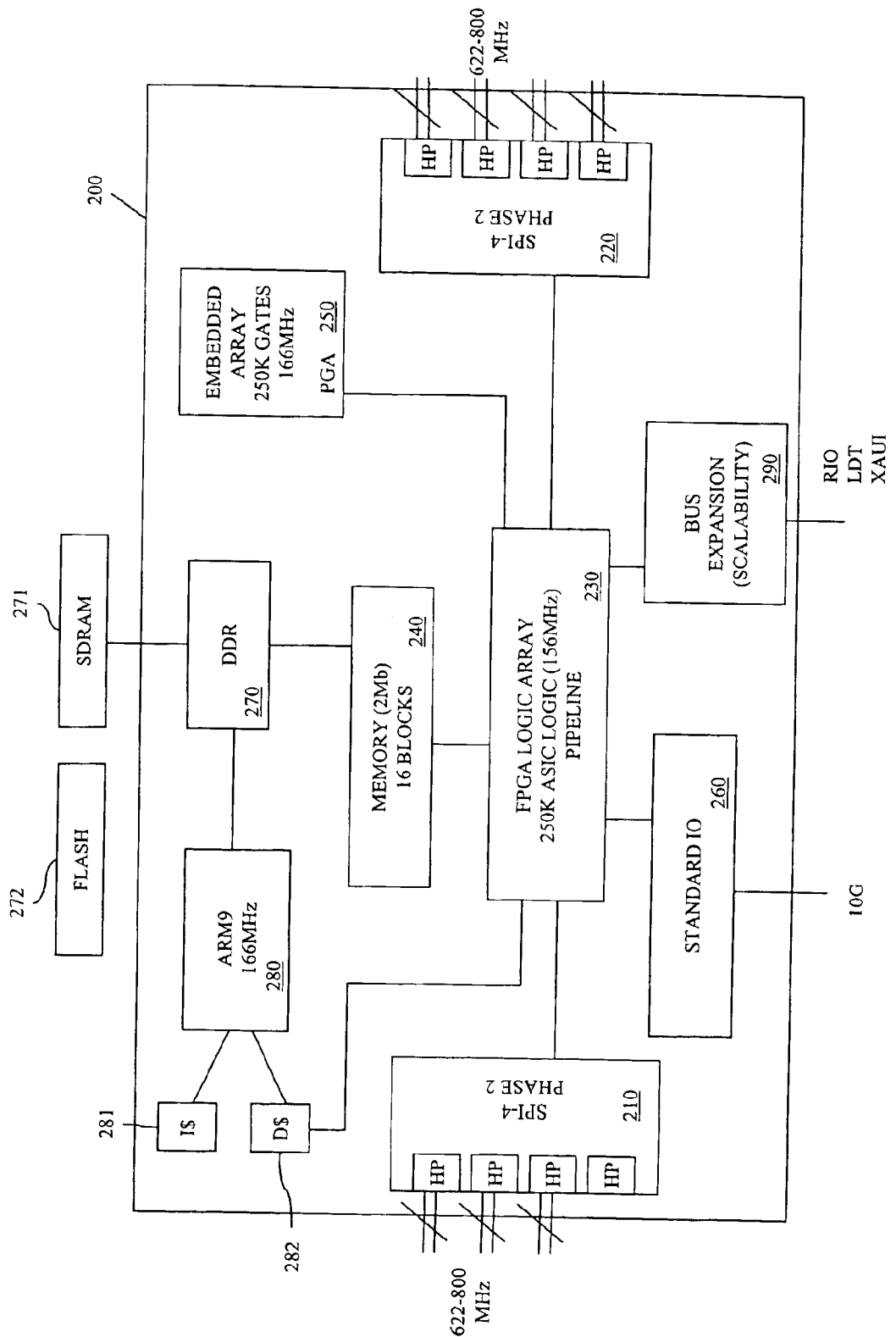
FIG. 2 illustrates a block diagram of an IC constructed according to the principles of the present invention.

Turning now to FIG. 2, illustrated is a block diagram of an IC constructed according to the principles of the present invention. The IC, generally designated 200, is formed on a single substrate (which, in the illustrated embodiment, includes silicon) and contains several functional blocks (or "macrocells") which cooperate together to perform a desired function, which is bridging external circuits such as those called out with reference to FIG. 1.

The IC 200 includes at least two interfaces 210, 220 which are illustrated as being SPI-4 interfaces, but which may be any suitable conventional type (such as an XAUI interface) or later-discovered type. A PGA 250 and an FPGA 230 are coupled to the at least two interfaces 210, 220 to effect the communication of data between the at least two interfaces 210, 220.

A PGA 250 is illustrated as being coupled to the FPGA 230. The PGA 250 is configured to cooperate with the FPGA 230 to adapt the IC 200 to a particular surrounding environment (including the external circuits that the IC 200 is called upon to bridge). The manner in which this cooperation comes about will be set forth in greater detail with respect to FIG. 3 herein.

Other functional blocks are also illustrated as being in the IC 200 of FIG. 2. A standard input-output interface 260 is coupled to the FPGA 230. The interface 260 may provide, for example, a 10 gigabit path to and from the IC 200, perhaps for control purposes. A memory interface 270 is coupled to the configuration memory 240. The memory interface 270 is illustrated as being a double data rate (DDR) interface, but may be any suitable type. The memory interface 270 provides access to memory (such as synchronous dynamic random access memory, or SDRAM, 271 or flash memory 272) that is external to the IC 200 and supplements the embedded memory 240.

A co-processor 280 is illustrated as being coupled to the embedded memory 240. The co-processor 280 may be employed to assist the FPGA 230 in certain tasks, as those skilled in the pertinent art will understand. The co-processor 280 may be an advanced reduced instruction set computer (RISC) machine (ARM), but may be of any other suitable type. The co-processor 280 may be of a Harvard architecture and therefore may have a separate instruction cache memory 281 and data cache memory 282 to increase its performance.

A bus expander 290 is illustrated as being coupled to the FPGA 230. The bus expander 290 advantageously allows the IC 200 to be coupled to other ICs, perhaps of the same type. The coupling together of multiple ICs can yield a bridge having substantial processing power.

Those skilled in the art should understand that the standard input-output interface 260, the memory interface 270, the SDRAM 271, the co-processor 280, the instruction cache memory 281, the data cache memory 282 and the bus expander 290 are optional and may be eliminated or substituted for in whole or in part by other functional blocks as a particular application may find advantageous.

In the illustrated embodiment, the PGA 250 is transparent to the person who is configuring the FPGA. As far as the person is concerned, he is configuring a conventional FPGA. Portions of the configuration he designs may call upon functions embedded in the PGA. Those portions should be carried out substantially faster in the PGA than in the FPGA, but otherwise the person need not change his design methodology to accommodate the PGA. Of course, this need not be the case, and the person may be given programmatical access to the PGA's functions.

Though the IC 200 is illustrated in general terms, one embodiment may employ a 250K gate FPGA operating at 156 MHz, a 2 Mb, 16 block memory and a 250K gate PGA operating at 166 MHZ.

Figure 3:
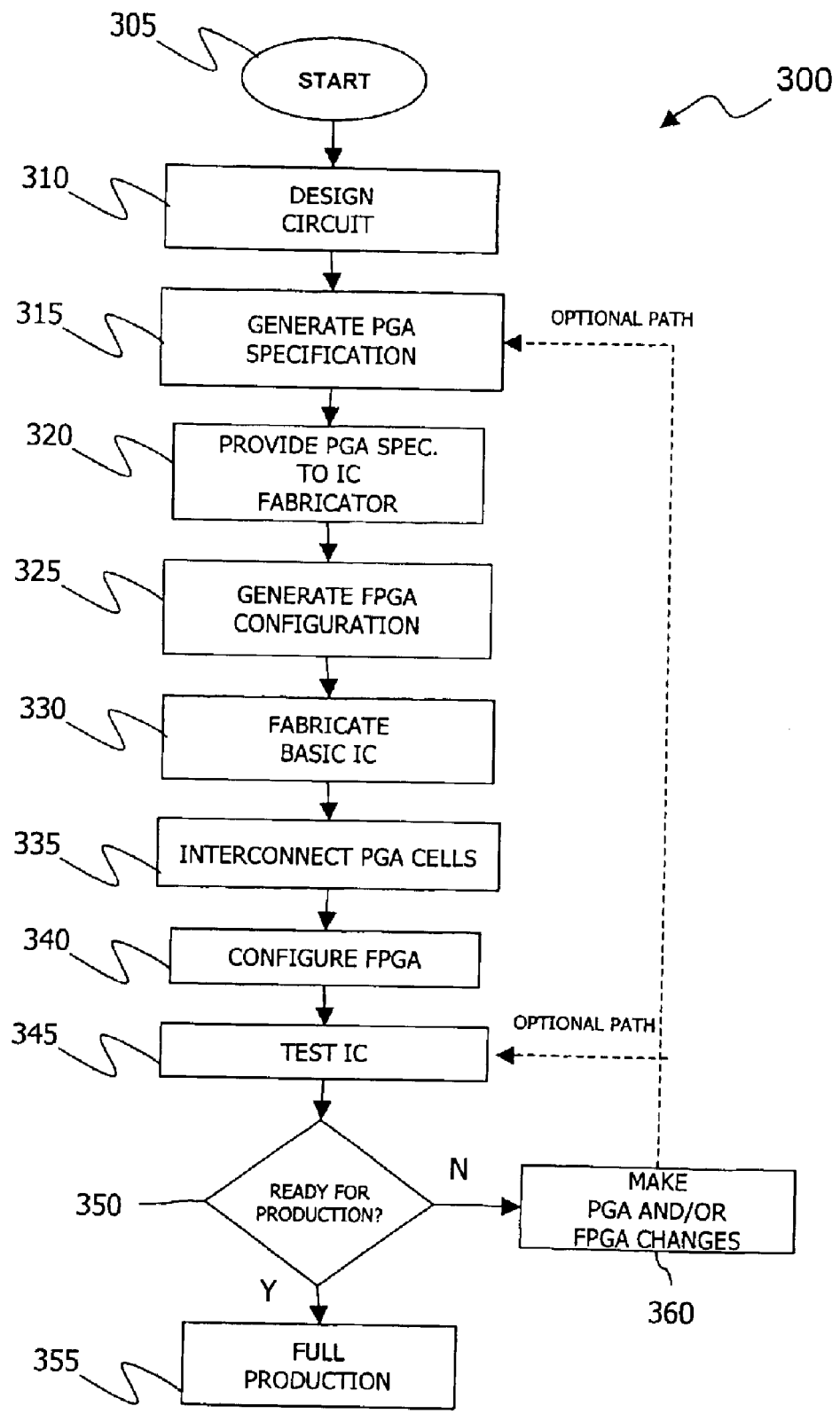
FIG. 3 illustrates a flow diagram of a method of manufacturing an IC suited for a particular application and carried out according to the principles of the present invention.

In understanding the principles and advantages of the present invention, it is helpful to describe the process by which an IC is manufactured. Accordingly, turning now to FIG. 3, illustrated is an exemplary method, generally designated 300, of manufacturing an IC suited for a particular application and carried out according to the principles of the present invention.

The method begins in a start step 305, wherein a customer wants to create a PGA/FPGA-based IC that is adapted to bridge two external circuits between which an interface mismatch exists. It is further assumed that a pure FPGA IC would not be adequate to bridge the external circuits due to its speed limitations.

In a step 310, a circuit designer (not shown) designs a circuit that bridges the two external circuits. The circuit designer may use a high-level hardware description language (HDL) or any other conventional or later-discovered methodology in designing such IC.

Part of the process of designing the PGA/FPGA IC is generating (in a step 315) a specification describing the configuration that the PGA is to assume. This specification may take the form of a well-known netlist or any other conventional or later-discovered methodology. Even programming languages, such as C, may be employed to generate specifications. Once the netlist or other specification is developed, it is provided, in a step 320, to an IC fabricator.

Another part of the process of designing the PGA/FPGA IC is generating (in a step 325) a configuration that is to be loaded into the FPGA at its initiation. When so stored, the configuration of the PGA and the configuration of the FPGA cooperate with one another to achieve the desired bridge functions. Because the FPGA is customer-programmable, the customer can retain the configuration pending delivery of the IC by the IC fabricator. As an aside, the customer may develop software for any co-processor that may be t, required for the IC.

Having received the PGA configuration from the customer, the IC fabricator employs a standard set of reticles it has on hand to fabricate an IC having at least two interfaces, an FPGA with associated memory and PGA cells in a step 330. Then, employing an interconnect reticle made specifically for the customer to effect the PGA configuration specified in the specification, the PGA cells are interconnected in a step 335.

At this point, the IC is delivered to the customer for evaluation and FPGA programming in a step 340. The customer loads any FPGA configuration he may find necessary or preferable into the memory (240 of FIG. 2) and initiates the IC, causing the FPGA to assume the configuration in the step 340.

The customer then places the IC in an actual operating environment or a test apparatus that simulates the actual operating environment in a step 345. The IC is tested and its efficacy determined in a decisional step 350. If the IC tests are positive (YES branch of the decisional step 350), the IC may be placed in full production in a step 355.

If the IC tests are negative (NO branch of the decisional step 350), certain changes may be required in a step 360. Changes may be advantageously made to the FPGA configuration without requiring the PGA to be redesigned (represented by the broken line coupling the step 360 to the step 345). A function that was to have been performed in the PGA can be disabled therein and relocated to the FPGA if the FPGA can accommodate the function's speed requirement. If the function requires the PGA's speed, the PGA configuration can be redesigned and updated ICs fabricated (represented by the broken line coupling the step 360 to the step 315).

Given the efficiency of this design process, a fully functional IC suitable for full production should result with few, if any, design iterations. Further, from the IC fabricator's standpoint, the standard set of reticles it has on hand to fabricate the interfaces, PGA cells and FPGA can be used repeatedly to form ICs having a wide variety of functions, including bridging.

Although the present invention has been described in detail, those skilled in the art should understand that they can make various changes, substitutions and alterations herein without departing from the spirit and scope of the invention in its broadest form. In particular, the IC 200 of FIG. 2 need not include the co-processor 280, which is optional.

What is claimed is:

1. An integrated circuit (IC), comprising:
   at least two interfaces;
   a programmable gate array (PGA) coupled to said at least two interfaces for communicating data therebetween; and
   a field-programmable gate array (FPGA) having a configuration memory associated therewith and coupled to and configured to cooperate with said PGA to adapt said IC to a particular surrounding environment, said PGA and FPGA integrated in said IC.

2. The IC as recited in claim 1 further comprising a standard input-output interface.

3. The IC as recited in claim 1 further comprising a second standard input-output interface.

4. The IC as recited in claim 1 further comprising a double data rate interface.

5. The IC as recited in claim 1 further comprising a co-processor coupled to embedded memory.

6. The IC as recited in claim 1 wherein said at least two interfaces are selected from the group consisting of:
   a system physical interface (SPI), and
   a 10-Gigabit Attachment Unit Interface (XAUI).

7. The IC as recited in claim 1 further comprising a bus expander coupled to said PGA.

8. A method of manufacturing an integrated circuit (IC) suited for a particular application, comprising:
   forming an integrated circuit having a substrate, at least two interfaces, and including integrating in said integrated circuit a field-programmable gate array (FPGA) and a programmable gate array (PGA);
   configuring said PGA with at least a portion of a design; and
   subsequently providing a configuration program to configure said FPGA to cooperate with said PGA to adapt said IC to a particular surrounding environment.

9. The method as recited in claim 8 further comprising forming a standard input-output interface on said substrate.

10. The method as recited in claim 8 further comprising forming a second standard input-output interface on said substrate.

11. The method as recited in claim 8 further comprising forming a double data rate interface on said substrate.

12. The method as recited in claim 8 further comprising forming a co-processor on said substrate.

13. The method as recited in claim 8 wherein said at least two interfaces are selected from the group consisting of:
   a system physical interface (SPI), and
   a 10-Gigabit Attachment Unit Interface (XAUI).

14. The method as recited in claim 8 further comprising forming a bus expander on said substrate.

* * * * *